United States Patent
Kumar (10) Patent No.: US 10,135,390 B2
(45) Date of Patent: Nov. 20, 2018

(54) PERIODIC KICK-STARTER FOR A CRYSTAL OSCILLATOR

(71) Applicant: Microchip Technology Incorporated, Chandler, AZ (US)

(72) Inventor: Ajay Kumar, Phoenix, AZ (US)

(73) Assignee: MICROCHIP TECHNOLOGY INCORPORATED, Chandler, AZ (US)

(*) Notice: Subject to any disclaimer, the term of this patent is extended or adjusted under 35 U.S.C. 154(b) by 189 days.

(21) Appl. No.: 15/186,034

(22) Filed: Jun. 17, 2016

(65) Prior Publication Data

US 2016/0373056 A1 Dec. 22, 2016

Related U.S. Application Data

(60) Provisional application No. 62/183,027, filed on Jun. 22, 2015.

(51) Int. Cl.
  *H03B 5/06* (2006.01)
  *H03B 5/36* (2006.01)
  *H03K 3/0233* (2006.01)
  *H03K 21/38* (2006.01)
  *H03L 3/00* (2006.01)

(52) U.S. Cl.
  CPC ............ *H03B 5/06* (2013.01); *H03B 5/364* (2013.01); *H03B 5/366* (2013.01); *H03K 3/02337* (2013.01); *H03K 21/38* (2013.01); *H03L 3/00* (2013.01); *H03B 2200/0094* (2013.01)

(58) Field of Classification Search
  CPC .... H03L 1/02; H03B 5/06; H03B 5/00; H03B 5/364; H03K 3/02337; H03K 21/38
  USPC ............ 331/158, 2, 111, 116 FE, 116 R, 145
  See application file for complete search history.

(56) References Cited

U.S. PATENT DOCUMENTS

| | | | |
|---|---|---|---|
| 5,594,388 A * | 1/1997 | O'Shaughnessy | H03K 3/03 331/1 R |
| 7,425,852 B2 | 9/2008 | Garzarolli et al. | 327/156 |
| 8,643,445 B1 | 2/2014 | Samala | 331/183 |
| 2005/0083139 A1 | 4/2005 | Gazit | 331/158 |
| 2008/0042755 A1 | 2/2008 | Feygin et al. | 331/2 |
| 2016/0308491 A1 * | 10/2016 | Elgaard | H03B 5/06 |

OTHER PUBLICATIONS

Zou, Zhige et al., "A Novel Schmitt Trigger with Low Temperature Coeficient," IEEE Asia Pacific Congerence on Circuits and Systems, 4 pages, Nov. 30, 2008.
Denier, Urs, "Analysis and Design of an Ultralow-Power CMOS Relaxation Oscillator," IEEE Transactions on Circuits and Systems—I: Regular Papers, vol. 57, No. 8, 10 pages, Aug. 1, 2010.
International Search Report and Written Opinion, Application No. PCT/US2016/038465, 13 pages, dated Oct. 31, 2016.

* cited by examiner

*Primary Examiner* — Arnold Kinkead
(74) *Attorney, Agent, or Firm* — Slayden Grubert Beard PLLC (57) ABSTRACT

A cyclical pulsing oscillator having a pulse repetition rate close to a crystal resonant frequency in an oscillator provides more useful start-up energy to the crystal oscillator circuit and thus provides much faster start-up time. The start-up pulsing oscillator runs for a number of cycles or until the crystal oscillator amplitude as built up to a desired value. The pulsing oscillator may have a repetition rate of from about one-third to about one-half the crystal resonant frequency, thus providing more useful start-up energy to the crystal oscillator circuit.

23 Claims, 6 Drawing Sheets

PERIODIC KICK-STARTER FOR A CRYSTAL OSCILLATOR

RELATED PATENT APPLICATION

This application claims priority to U.S. Provisional Patent Application No. 62/183,027; filed Jun. 22, 2015; which is hereby incorporated by reference herein for all purposes.

TECHNICAL FIELD

The present disclosure relates to crystal oscillators in particular to a periodic kickstarter for a crystal oscillator to reduce the turn-on time of the oscillator.

BACKGROUND

Appropriately cut quartz crystals can be used as high-quality electromechanical resonators. Their piezoelectric properties (voltage across the crystal deforms it; deforming the crystal generates a voltage) allow them to be the frequency-determining element in electronic circuits. Crystals are widely used in oscillators, time bases, and frequency synthesizers for their high quality factor (QF); excellent frequency stability; tight production tolerances; and relatively low cost. All crystal oscillator circuits have a start-up time. Start-up time is an important consideration in battery-powered applications where the device is often switched on and off. Shorter oscillator start-up times reduce wasted energy in low-power systems.

The definition for the start-up time of a crystal oscillator can vary, depending on the type of system. For a microprocessor system, the start-up time is often the time from initial power application to the time a stable clock signal is available. The start-up time for a phase-locked loop (PLL) is often the time from initial power application to when a stable reference signal is available, often settled to within an acceptable frequency offset from the final steady state oscillation frequency. The start-up time of a crystal oscillator may be determined by the noise or transient conditions at turn-on; small-signal envelope expansion due to negative resistance; and large-signal amplitude limiting.

Crystal oscillators are known to have a long start-up time. Once there is a small build-up of signal which itself takes a long time, they may take additional 2,000 to 8,000 cycles to settle based on their motion arm inductance. For a 32 KHz oscillator start-up time can be over 3 to 4 seconds, and for 24-32 MHz, start-up time may extend up to 5-20 milliseconds. These long start-up times of the crystal oscillators have been reported as a problem by many users. Kick starting of the crystal oscillator with a mono-stable one shot oscillator has been employed at equipment turn-on but has not always been successful since the energy frequency spectrum of a single pulse from a mono-stable one shot oscillator tends to fall far outside the crystal oscillation operating frequency and thus cannot add enough energy to the crystal-inductor element for quick and reliable start-up of the crystal oscillator circuit.

SUMMARY

Therefore a need exists for a way to decrease start-up time of a crystal oscillator.

According to an embodiment, {{{will added after claims finalized}}}.

According to a further embodiment, {{{will added after claims finalized}}}.

BRIEF DESCRIPTION OF THE DRAWINGS

A more complete understanding of the present disclosure may be acquired by referring to the following description taken in conjunction with the accompanying drawings wherein.

While the present disclosure is susceptible to various modifications and alternative forms, specific example embodiments thereof have been shown in the drawings and are herein described in detail. It should be understood, however, that the description herein of specific example embodiments is not intended to limit the disclosure to the particular forms disclosed herein.

DETAILED DESCRIPTION

According to various embodiments of this disclosure, a pulsing oscillator having a pulse repetition rate close to the crystal oscillator resonant frequency provides more useful start-up energy to the crystal oscillator circuit and thus provides a much faster start-up time. The start-up pulsing oscillator may run, for example but is not limited to, 16 to 64 pulses, or until the crystal oscillator amplitude has built up to a desired value.

Referring now to the drawings, the details of example embodiments are schematically illustrated. Like elements in the drawings will be represented by like numbers, and similar elements will be represented by like numbers with a different lower case letter suffix.

Figure 1:
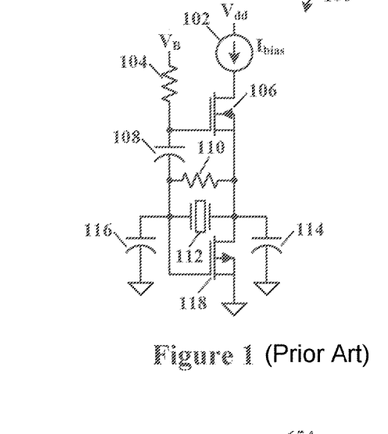
FIG. 1 illustrates a schematic diagram of a conventional crystal oscillator circuit.

Referring to FIG. 1, depicted is a schematic diagram of a crystal oscillator circuit. This crystal oscillator circuit, generally referenced by the numeral 100, may comprise a current source 102, a first resistor 104, a P-Channel metal oxide semiconductor (PMOS) field effect transistor (FET) 106, a first capacitor 108, a second resistor 110, a crystal frequency determining element 112, a second capacitor 114, a third capacitor 116, and an NMOS FET 118 configured in a totem pole circuit configuration with the PMOS FET 106. The crystal oscillator circuit 100 depends on circuit noise energy to start up its oscillation, and takes the longest time to come up to full operational oscillation output. A crystal oscillator circuit 100 oscillating at 32 KHz may take up to three to four seconds to start-up, and a 32 MHz oscillator may take about 5 to 20 milliseconds for start-up.

This is a standard crystal oscillator circuit design, and one having ordinary skill in electronic circuit design and the benefit of this disclosure could easily come up with other crystal oscillator circuit designs that work equally well. All of these other crystal oscillator circuits are applicable to this disclosure and are contemplated herein.

Figure 2:
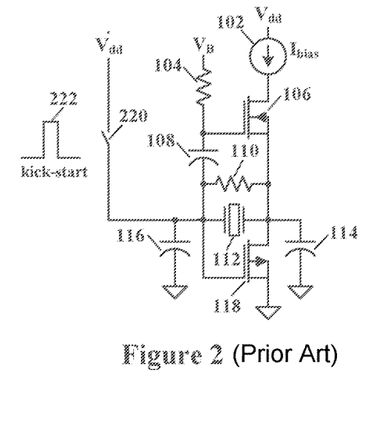
FIG. 2 illustrates a schematic diagram of a conventional crystal oscillator having a single pulse kick-start circuit.
Figure 3:
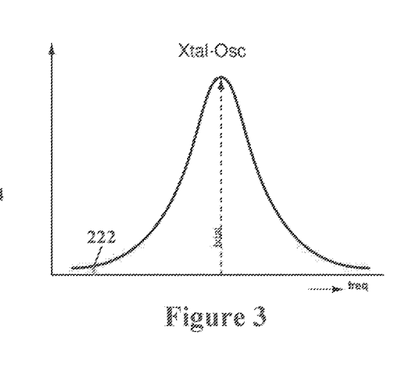
FIG. 3 illustrates a schematic frequency-amplitude graph of a crystal.

Referring to FIG. 2, depicted is a schematic diagram of a crystal oscillator having a single pulse kick-start circuit. This is the same crystal oscillator circuit 100 as shown in FIG. 1 but has a kick-start input comprising a kick-start switch 220 that provides energy with a single pulse 222 to the crystal oscillator circuit 100. This single pulse 222 has very little energy that is useful in starting up the crystal oscillator circuit 100 because it has a wide frequency spectrum with very little energy content within the crystal bandwidth. Only a small portion of the energy from this pulse will fall within the crystal bandwidth range as shown in FIG. 3. Also the energy in a single kick-start pulse is an inverse functional of frequency, thus the higher the frequency of the oscillator the lower the effectiveness will be of the single kick-starter circuit. Simulations have shown that the crystal oscillator of FIG. 2 may take from about 2,000 to 8,000 cycles after a single pulse 222 kick-start. Parasitic circuit capacitances also may attenuate energy from the single pulse and sometimes the crystal oscillator may not start-up at all.

Figure 4:
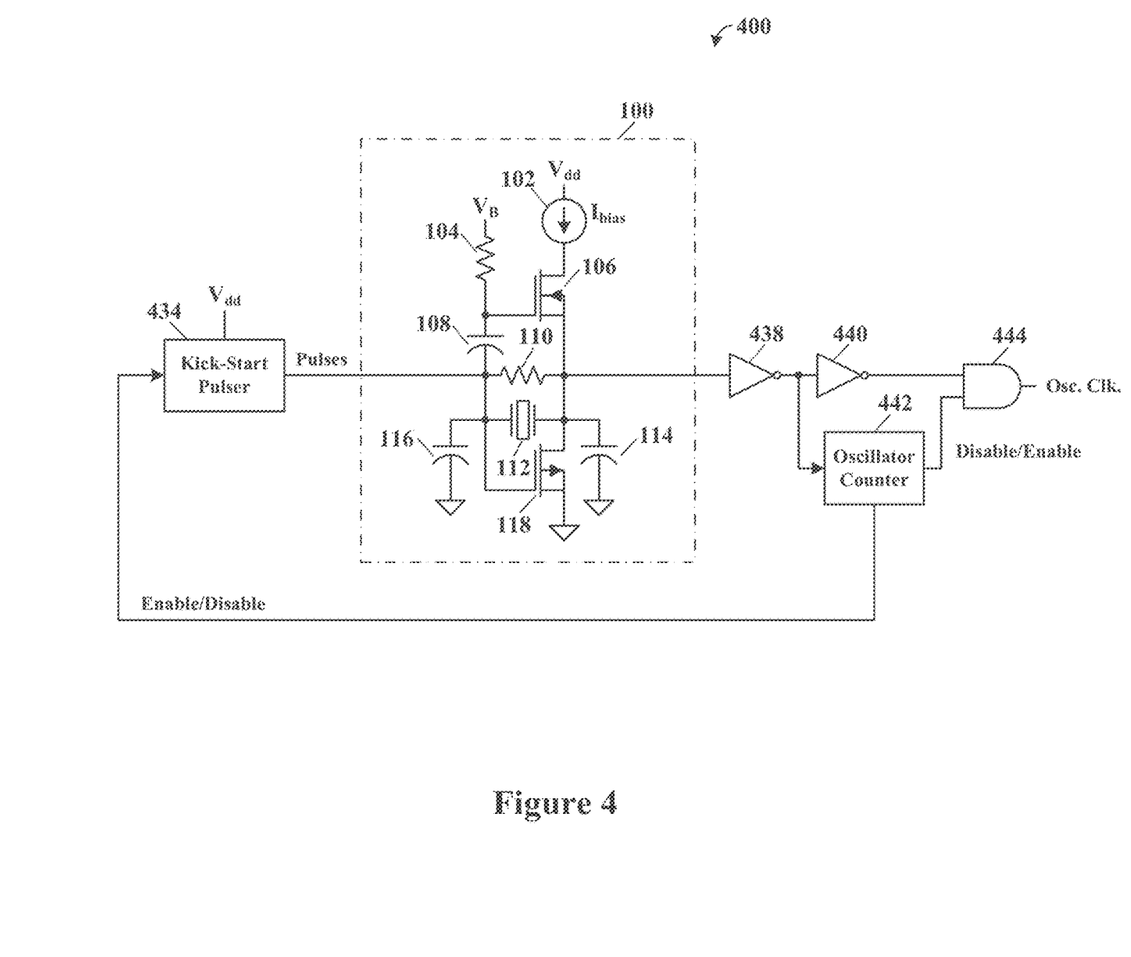
FIG. 4 illustrates a schematic circuit and block diagram of a crystal oscillator having a periodic kickstarter, according to a specific example embodiment of this disclosure.

Referring to FIG. 4, depicted is a schematic circuit and block diagram of a crystal oscillator having a periodic kickstarter, according to a specific example embodiment of this disclosure. This crystal oscillator having a periodic kickstarter, generally represented by the numeral 400, may comprise a crystal oscillator circuit 100, a kick-start pulser 434, inverters 438 and 440, an oscillator counter 442 and an AND gate 444. The kick-start pulser 434 may have a pulse repetition rate (frequency) of from about one-third to about one-half the center frequency of the crystal 112. These repletion rates may provide substantial energy to the crystal oscillator circuit 100, and this periodic signal with its fundamental and harmonic frequencies can excite the crystal oscillator circuit 100. It is contemplated and within the scope of this disclosure that a pulser kicking frequency may be within a decade of the center-frequency of the crystal and be effective with the specific example embodiments of this disclosure.

Figure 7:
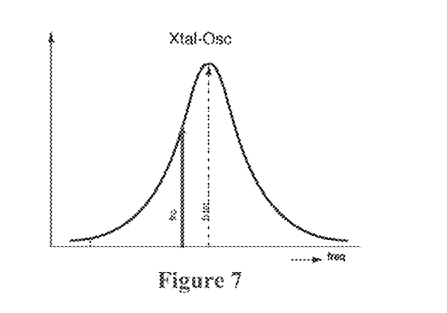
FIG. 7 illustrates a schematic frequency-amplitude graph of a crystal showing kick-start pulses within the frequency bandwidth of the crystal, according to the teachings of this disclosure.

The crystal oscillator circuit 100 may be pulsed, for example but is not limited to, 16-32 times with the kick-start pulser 434 thereby feeding a substantial amount of energy into the frequency band-pass range of the crystal 112 as shown in FIG. 7. The kick-start pulser 434 provides a periodic signal that effectively excites with its fundamental and harmonic energy the L-C tank circuit of the crystal 112. Typically the crystal oscillator with periodic kick-start 400 may start over ten times faster than just the crystal oscillator circuit 100 without any pulse excitation. A crystal oscillator requires a smaller gm to maintain oscillation once crystal oscillation has been established. Therefore, a higher energy kick-starter will allow the crystal oscillator to run at lower power.

The oscillator counter 442 monitors the number of cycles from the time that the crystal oscillator circuit 100 has enough output voltage amplitude to drive the inverter 438. When a sufficient number of cycles, e.g., 2048 or 4096, have been counted by the oscillator counter 442, its overflow output will enable the oscillator clock from the output of the AND gate 444, and disable the kick-start pulser 434. Reset of the counter 442 may be done with a power-on-reset or external reset command (not shown).

Figure 8:
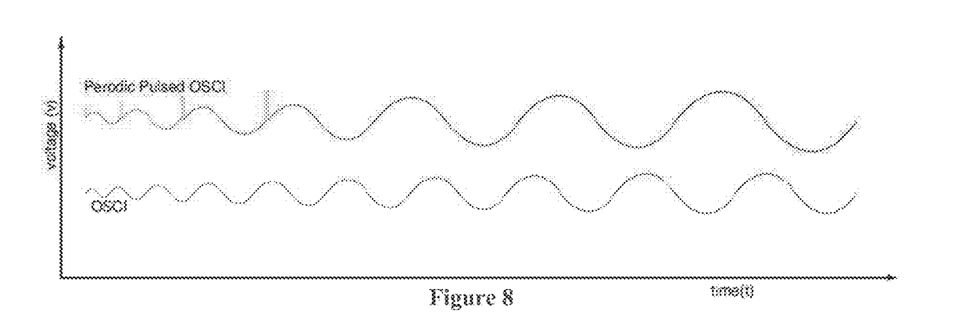
FIG. 8 illustrates schematic frequency-amplitude graphs of the start-up of a crystal oscillator using kick-start pulses within the frequency bandwidth of the crystal, according to the teachings of this disclosure.

FIG. 8 shows schematic frequency-amplitude graphs of the start-up of a crystal oscillator using kick-start pulses within the frequency bandwidth of the crystal versus no kick-start pulses (lower graph). A faster output amplitude increase is depicted for the crystal oscillator output amplitude (upper graph) with the periodic pulses from the kick start pulser 434.

Figure 5:
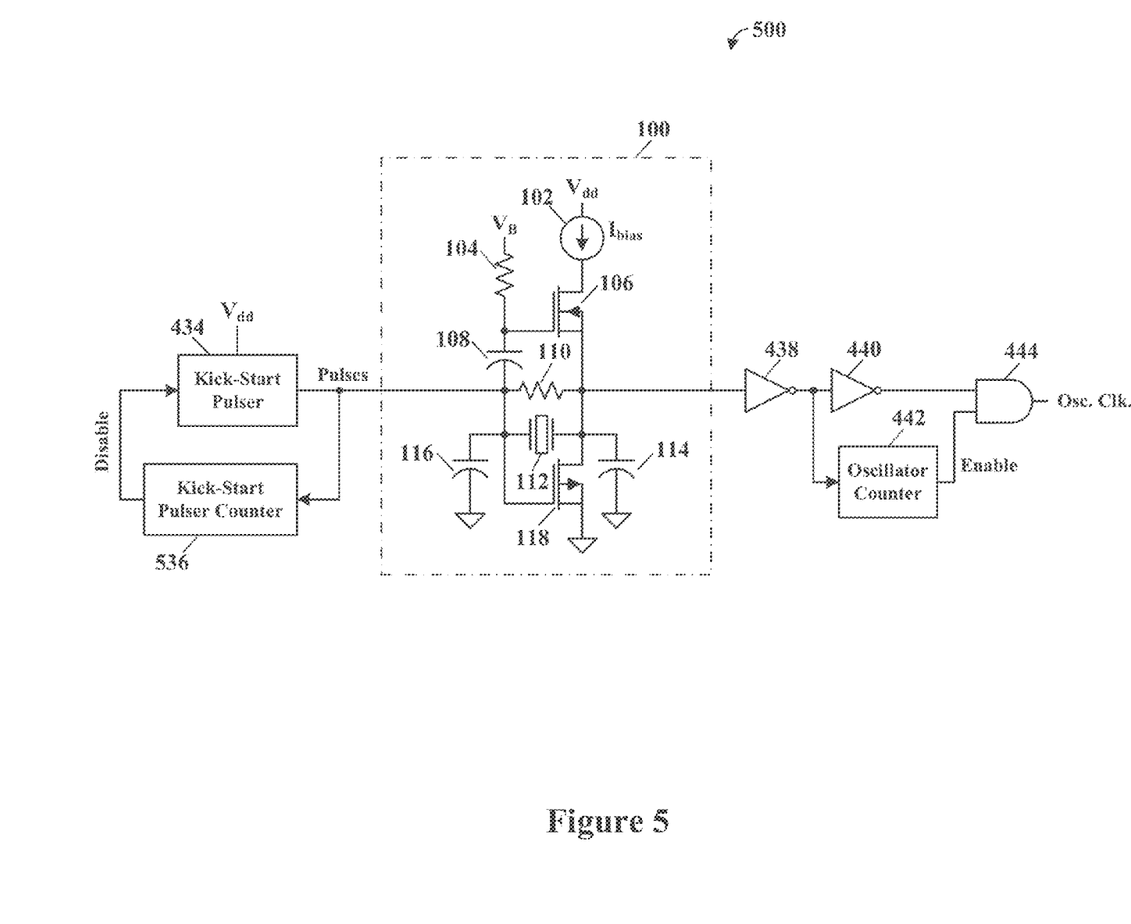
FIG. 5 illustrates a schematic circuit and block diagram of a crystal oscillator having a periodic kickstarter, according to another specific example embodiment of this disclosure.

Referring to FIG. 5, depicted is a schematic circuit and block diagram of a crystal oscillator having a periodic kickstarter, according to another specific example embodiment of this disclosure. This crystal oscillator having a periodic kickstarter, generally represented by the numeral 500, may comprise a crystal oscillator circuit 100, a kick-start pulser 434, inverters 438 and 440, an oscillator counter 442, an AND gate 444, and a kick-start pulser counter 536. The crystal oscillator 500 works in substantially the same as the crystal oscillator 400 described hereinabove. However, a kick-start pulser counter 536 has been added to limit the number of pulses from the kick-start pulser 434, for example but not limited to 64.

Figure 6:
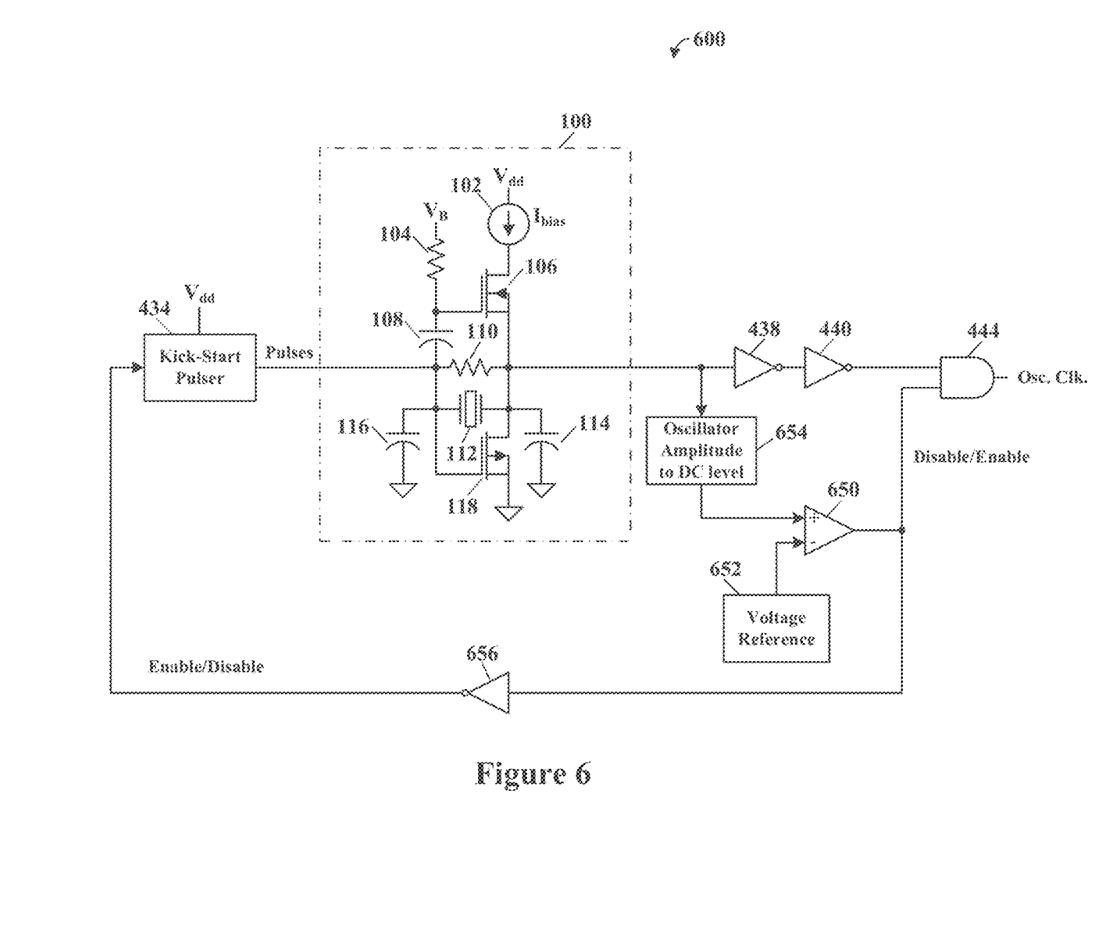
FIG. 6 illustrates a schematic circuit and block diagram of a crystal oscillator having a periodic kickstarter, according to yet another specific example embodiment of this disclosure.

Referring to FIG. 6, depicted is a schematic circuit and block diagram of a crystal oscillator having a periodic kickstarter, according to yet another specific example embodiment of this disclosure. This crystal oscillator having a periodic kickstarter, generally represented by the numeral 600, may comprise a crystal oscillator circuit 100, a kick-start pulser 434, inverters 438, 440 and 656, an AND gate 444, an oscillator output amplitude to DC level converter 654, a voltage comparator 650 and a voltage reference 652. The crystal oscillator 600 works in substantially the same way as do the crystal oscillators 400 and 500 regarding excitation from the kick-start pulser 434 as described more fully hereinabove. However instead of counting the number of kick-start pulses and/or oscillator startup cycles, a simple peak voltage detector is provided so that when the output amplitude of the crystal oscillator circuit 100 reaches a desired amplitude value the kick-start pulser 434 is disabled and the oscillator clock output from the AND gate 444 is enabled. With this peak detector circuit of FIG. 6 the kick-start pulser 434 will be disabled as soon as the desired output amplitude from the crystal oscillator circuit 100 is achieved, and the oscillator clock output from the AND gate 444 will be enabled. Also if the output amplitude of the crystal oscillator circuit 100 should become less than the desired amplitude value, then the kick-start pulser 434 may be re-enabled and the oscillator clock from the output of AND gate 444 inhibited (disabled).

Figure 9:
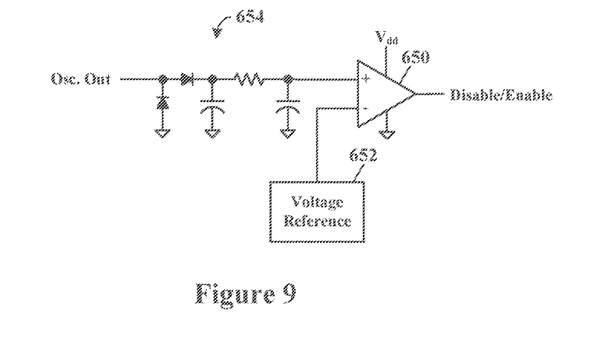
FIG. 9 illustrates a schematic diagram of a crystal oscillator output amplitude level detector for enabling/disabling a kick-start pulser, according to the specific example embodiment shown in FIG. 6.

Referring to FIG. 9, depicted is a schematic diagram of a crystal oscillator output amplitude level detector and enable/disable circuit for a kick-start pulser according to the specific example embodiment shown in FIG. 6. A simple diode rectifier 654 or an envelope detector circuit may be used to rectify the high frequency oscillator waveform and provide a DC voltage level representative of the amplitude of the oscillator output waveform. A RC low pass filter may be coupled between the output of the diode rectifier 654 and a first input of the voltage comparator 650. A second input of the voltage comparator 650 is coupled to the voltage reference 652. In the circuit configuration shown in FIG. 9, whenever the voltage on the first input (+) is greater than a reference voltage from the voltage reference 652 the output thereof goes to a logic high, and may be used to enable the clock oscillator output from the AND gate 444 and disable the kick-start pulser 434.

Figure 10:
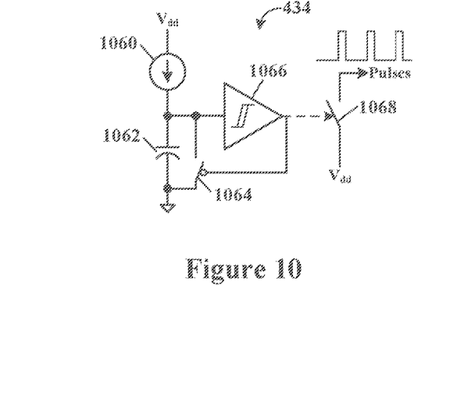
FIG. 10 illustrates a schematic diagram of a kick-start pulser circuit, according to specific example embodiments of this disclosure.

Referring to FIG. 10, depicted is a schematic diagram of a kick-start pulser circuit, according to specific example embodiments of this disclosure. The kick-start pulser 434 may comprise a current source 1060, a timing capacitor 1062, switches 1064 and 1068, and a comparator 1066 with hysteresis. As the current source 1060 charges the capacitor 1062 the voltage rises across its plates. The voltage across the capacitor 1062 is sensed by the comparator 1066. When the voltage crosses the threshold voltage of the comparator 1066 its output changes logic levels which is turn controls the switch 1064 connected across the two plates of the capacitor 1062. When the output of the comparator 1066 goes to a logic low it enables (closes) the switch 1064 across the capacitor 1062 and shorts the two plates of the capacitor 1062 together, thereby removing any voltage difference therebetween. With the voltage across the plates of the capacitor 1062 drops to substantially zero volts the comparator 1066 output returns to a logic high and disables (opens) the switch 1064 across the capacitor 1062, thereby allowing the current source 1060 to begin charging a voltage on the capacitor 1062 again. This charging and discharging of capacitor 1062 creates a periodic wave form which is used to pulse the crystal oscillator circuit 434. The kick-start pulser 434 circuit shown in FIG. 10 is representative of a clock generator circuit. One skill in the art of electronic circuit design and having the benefit of this disclosure may readily come-up with several different designs of circuits that create periodic waveforms that may be used with the kick-start circuits described in this disclosure.

Figure 11:
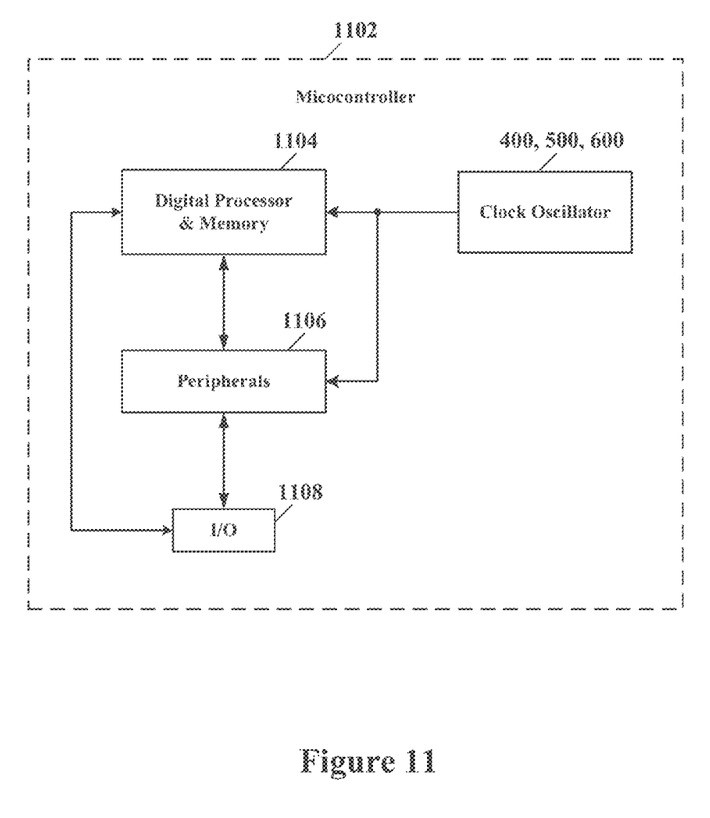
FIG. 11 illustrates a schematic block diagram of a microcontroller comprising the crystal oscillator circuit shown in FIG. 4, 5 or 6, according to the teachings of this disclosure.

Referring to FIG. 11, depicted is a schematic block diagram of a microcontroller comprising the crystal oscillator circuit shown in FIG. 4, 5 or 6, according to the teachings of this disclosure. A microcontroller 1102 may comprise a digital processor and memory 1104, peripheral modules 1106, input/output 1108 and a clock oscillator 400, 500 or 600. The crystal oscillator embodiments disclosed herein allow the microcontroller 1102 to start operation sooner since a clock oscillator output will be available and stable in less time than if no kick-start pulser 434 is provided with the crystal oscillator circuit.

The invention claimed is:

1. An integrated oscillator configured to be coupled with an external crystal, comprising:
    an oscillator circuit coupled with the external crystal; and
    start-up circuit comprising a kick-start pulser coupled to the oscillator circuit and pulsing start-up energy thereto
    wherein the kick-start pulser comprises a current source charging a capacitor, a discharging switch coupled in parallel with the capacitor wherein a node between the current source and the capacitor is coupled to an input of a comparator whose output controls the discharging switch, and a pulsing switch controlled by the comparator and coupled to the oscillator circuit.

2. The integrated oscillator according to claim 1, wherein the kick-start pulser generates periodic pulses having a pulse repetition rate from about one-third to about one-half the center frequency of the external crystal.

3. The integrated oscillator according to claim 1, wherein the comparator has hysteresis.

4. The integrated oscillator according to claim 1, further comprising a digital counter which disables the start-up circuit after a predetermined number of pulses generated by the start-up circuit.

5. The integrated oscillator according to claim 4, wherein the predetermined number of pulses is from about 16 to about 32 pulses.

6. The integrated oscillator according to claim 4, wherein the predetermined number of pulses is from about 32 to about 64 pulses.

7. The integrated oscillator according to claim 1, further comprising:
    an oscillator cycle counter coupled to the crystal oscillator; and
    a logic gate for enabling and disabling an oscillator clock output;
    wherein the oscillator cycle counter will disable the kick-start pulser and enable the oscillator clock output through the logic gate after a certain number of cycles from the crystal oscillator are counted.

8. The integrated oscillator according to claim 1, further comprising:
    an oscillator output amplitude detector coupled to the crystal oscillator;
    a voltage reference providing a reference voltage; and
    a voltage comparator having a first input coupled to the oscillator output amplitude detector, and a second input coupled to the voltage reference, wherein when the detected oscillator output amplitude is greater than the reference voltage the kick-start pulser is disabled and a logic gate is enabled to provide the oscillator clock output.

9. A microcontroller comprising the integrated oscillator according to claim 1.

10. The microcontroller according to claim 9, wherein the microcontroller is configured to turn off the start-up circuit after the oscillator circuit has a stable oscillation amplitude.

11. The microcontroller according to claim 9, wherein the microcontroller is configured to turn off the start-up circuit after a predetermined time period after the microcontroller starts operating.

12. The integrated oscillator according to claim 1, wherein the oscillator circuit comprises:
    a current source coupled to a supply voltage;
    a first resistor coupled to a bias voltage;
    a first capacitor coupled to the first resistor;
    a second resistor coupled to the first capacitor;
    a first transistor coupled to the current source, first capacitor, and first and second resistors;
    a second capacitor coupled to the first capacitor and second resistor;
    a third capacitor coupled to the second resistor and first transistor;
    a second transistor coupled to the first, second and third capacitors, the second resistor and the first transistor; and
    the external crystal coupled to the first and second transistors; the first, second and third capacitors; and the second resistor.

13. An integrated oscillator, comprising:
    a crystal oscillator;
    a kick-start pulser coupled to the crystal oscillator; and a kick-start pulser counter coupled to the kick-start pulser, wherein the kick-start pulser will be disabled after a certain number of pulses are counted by the kick-start pulser counter, wherein the kick-start pulser comprises a current source charging a capacitor, a discharging switch coupled in parallel with the capacitor wherein a node between the current source and the capacitor is coupled to an input of a comparator whose output controls the discharging switch, and a pulsing switch controlled by the comparator and coupled to the oscillator circuit.

14. The integrated oscillator according to claim 13, wherein the comparator has hysteresis.

15. The integrated oscillator according to claim 13, further comprising:
   a oscillator cycle counter coupled to the crystal oscillator; and
   a logic gate for enabling and disabling an oscillator clock output;
   wherein the oscillator cycle counter is configured to enable the oscillator clock output from the logic gate after a certain number of cycles from the oscillator are counted.

16. A microcontroller comprising the integrated oscillator according to claim 13.

17. A integrated oscillator, comprising:
   a crystal oscillator;
   a kick-start pulser coupled to the crystal oscillator;
   a logic gate for enabling and disabling an oscillator clock output;
   an oscillator output amplitude detector coupled to the crystal oscillator;
   a voltage reference providing a reference voltage; and
   a voltage comparator having a first input coupled to the oscillator output amplitude detector, and a second input coupled to the voltage reference, wherein when the detected oscillator output amplitude is greater than the reference voltage the kick-start pulser is disabled and the logic gate is enabled to provide the oscillator clock output.

18. The integrated oscillator according to claim 17, wherein the kick-start pulser comprises a current source charging a capacitor, a discharging switch coupled in parallel with the capacitor wherein a node between the current source and the capacitor is coupled to an input of a comparator whose output controls the discharging switch, and a pulsing switch controlled by the comparator and coupled to the oscillator circuit.

19. A microcontroller comprising the integrated oscillator according to claim 17.

20. A method for starting an integrated oscillator configured to be coupled with an external crystal, said method comprising the steps of:
   coupling an oscillator circuit to the external crystal; and
   periodically feeding pulses into the oscillator circuit with a kick-start pulser by: charging a capacitor with a current source; discharging the capacitor with a switch that is controlled by a comparator when a voltage on the capacitor is reached; switching on and off a pulsing switch with the comparator, wherein the pulsing switch provides said pulses to the oscillator circuit.

21. The method according to claim 20, wherein the kick-start pulser generates periodic pulses having a pulse repetition rate from about one-third to about one-half the center frequency of the external crystal.

22. The method according to claim 20, wherein the comparator has hysteresis.

23. The integrated oscillator according to claim 1, wherein the comparator has hysteresis.

* * * * *